(12) United States Patent
Connell et al.

(10) Patent No.: US 6,949,834 B2
(45) Date of Patent: Sep. 27, 2005

(54) STACKED SEMICONDUCTOR PACKAGE WITH CIRCUIT SIDE POLYMER LAYER

(75) Inventors: Mike Connell, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 10/793,234

(22) Filed: Mar. 4, 2004

(65) Prior Publication Data

US 2004/0171191 A1 Sep. 2, 2004

Related U.S. Application Data

(62) Division of application No. 10/192,736, filed on Jul. 10, 2002, now Pat. No. 6,791,168.

(51) Int. Cl.[7] .............................................. H01L 23/48
(52) U.S. Cl. ....................... 257/777; 257/737; 257/784; 257/787
(58) Field of Search ................................ 257/777, 737, 257/784, 787

(56) References Cited

U.S. PATENT DOCUMENTS

| | | | |
|---|---|---|---|
| 6,097,087 A | 8/2000 | Farnworth et al. | |
| 6,181,154 B1 | 1/2001 | Beffa | |
| 6,198,162 B1 | 3/2001 | Corisis | |
| 6,199,743 B1 | 3/2001 | Bettinger et al. | |
| 6,294,825 B1 | 9/2001 | Bolken et al. | |
| 6,300,687 B1 | 10/2001 | Bertin et al. | |
| 6,303,981 B1 * | 10/2001 | Moden | 257/666 |
| 6,313,522 B1 | 11/2001 | Akram et al. | |
| 6,323,551 B1 * | 11/2001 | Anzai | 257/737 |
| 6,331,453 B1 | 12/2001 | Bolken et al. | |
| 6,343,019 B1 | 1/2002 | Jiang et al. | |
| 6,359,334 B1 | 3/2002 | Jiang et al. | |
| 6,372,552 B1 | 4/2002 | Kinsman et al. | |
| 6,376,279 B1 | 4/2002 | Kwon et al. | |
| 6,380,631 B2 | 4/2002 | Mess et al. | |
| 6,385,049 B1 | 5/2002 | Chia-Yu et al. | |
| 6,451,624 B1 | 9/2002 | Farnworth et al. | |
| 6,465,877 B1 | 10/2002 | Farnworth et al. | |
| 6,489,667 B1 * | 12/2002 | Shim et al. | 257/668 |
| 6,501,165 B1 | 12/2002 | Farnworth | |
| 6,507,107 B2 | 1/2003 | Vaiyapuri | |
| 6,507,114 B2 | 1/2003 | Hui et al. | |
| 6,552,426 B2 * | 4/2003 | Ishio et al. | 257/692 |
| 6,611,052 B2 | 8/2003 | Poo et al. | |
| 6,638,792 B2 | 10/2003 | Hui et al. | |
| 6,846,699 B2 * | 1/2005 | Sakurai | 438/108 |

* cited by examiner

*Primary Examiner*—Luan Thai
(74) *Attorney, Agent, or Firm*—Stephen A. Gratton

(57) ABSTRACT

A semiconductor package includes a substrate, a die attached and wire bonded to the substrate, and a die encapsulant encapsulating the die. The die includes a circuit side having a pattern of die contacts, planarized wire bonding contacts bonded to the die contacts, and a planarized polymer layer on the circuit side configured as stress defect barrier. A method for fabricating the package includes the steps of forming bumps on the die, encapsulating the bumps in a polymer layer, and then planarizing the polymer layer and the bumps to form the planarized wire bonding contacts. The method also includes the steps of attaching and wire bonding the die to the substrate, and then forming the die encapsulant on the die.

10 Claims, 7 Drawing Sheets

STACKED SEMICONDUCTOR PACKAGE WITH CIRCUIT SIDE POLYMER LAYER

CROSS REFERENCE TO RELATED APPLICATIONS

This application division of Ser. No. 10/192,736, filed on Jul. 10, 2002 now U.S Pat. No. 6,791,168.

This application is related to Ser. No. 10/426,320, filed on Jul. 21, 2003.

FIELD OF THE INVENTION

This invention relates generally to semiconductor packages and to methods of semiconductor packaging. More particularly, this invention relates to a semiconductor package having a die and a circuit side polymer layer on the die configured as a defect barrier. This invention also relates to a method for fabricating the package, and to systems incorporating the package.

BACKGROUND OF THE INVENTION

Different types of semiconductor packages have been developed recently with a smaller outline, and a higher pin count than conventional plastic or ceramic packages. These semiconductor packages are broadly referred to as BGA packages, chip scale packages or flip chip packages. One particular type of package is referred to as a board-on-chip (BOC) package.

Referring to FIG. 1A, a prior art BOC package 10 is illustrated. The BOC package 10 includes a substrate 12, terminal contacts 14 on the substrate 12, and a semiconductor die 16 attached to the substrate 12 in electrical communication with the terminal contacts 14. Typically the substrate 12 comprises a reinforced polymer laminate material, such as bismaleimide triazine (BT), or a polyimide resin, and the terminal contacts 14 comprise solder balls in a dense area array, such as a ball grid array (BGA). In addition, the substrate 12 includes patterns of metal conductors 24 in electrical communication with the terminal contacts 14. The conductors 24 typically fan out from bond pads 30 on the die 16 to the grid pattern of the terminal contacts 14.

The BOC package 10 also includes adhesive members 26, such as strips of adhesive tape, attaching a circuit side 32 of the die 16 to the substrate 12. The substrate 12 includes a bonding opening 28, and the die 16 is attached to the substrate 12 with the bond pads 30 on the circuit side 32 aligned with the bonding opening 28. In addition, wires 22 are placed through the opening 28, and are wire bonded to the bond pads 30 on the die 16 and to the conductors 24 on the substrate 12. The BOC package 10 also includes a die encapsulant 18 encapsulating the die 16, and a wire bond encapsulant 20 encapsulating the wires 22. The die encapsulant 18 and the wire bond encapsulant 20 typically comprise a plastic material, such as a Novoloc based epoxy, formed using transfer molding process.

As shown in FIG. 1B, the adhesive members 26 do not completely cover the circuit side 32 of the die 16. Accordingly, the die encapsulant 18, and also the wire bond encapsulant 20, can be in physical contact with exposed portions of the circuit side 32 of the die 16.

One problem with the BOC package 10 is that stress defects often develop in the die 16 following the packaging process. As used herein a "stress defect" means the die 16 has an improper circuit structure that produces a present or future electrical failure in the operation of the die 16 or elements thereof.

One type of stress defect 38 is illustrated in FIG. 1C. In this example, the die 16 includes interconnect conductors 34 on the circuit side 32 covered by a die passivation layer 36. The interconnect conductors 34 are in electrical communication with the bond pads 30, and with the integrated circuits (not shown) contained on the die 16. The stress defects 38 can comprise cracks that form in the die passivation layer 36 and in the interconnect conductors 34. These stress defects 38 can cause opens and shorts to occur in the interconnect conductors 34. Stress defects 38 can also occur on other elements on the die 16, such as on the bond pads 30.

It has been theorized that the stress defects 38 are caused by fillers in the die encapsulant 18, or in the wire bond encapsulant 20 that are in physical contact with the circuit side 32 of the die 16. For example, epoxies used for the die encapsulant 18 and the wire bond encapsulant 20 often contain silicates, such as $SiO_2$, that are used to adjust various physical or electrical characteristics of the epoxies. These fillers in physical contact with the circuits side 32 of the die 16 may be one source of stress defects 20.

The present invention is directed to an improved semiconductor package having a stress defect barrier, and to a method for fabricating the package.

SUMMARY OF THE INVENTION

In accordance with the present invention, an improved semiconductor package, a wafer level method for fabricating the package, and systems incorporating the package, are provided.

In a first embodiment, the package has a board on chip (BOC) configuration. The package includes a BOC substrate having a pattern of conductors, a semiconductor die attached to the BOC substrate and wire bonded to the conductors, and a die encapsulant encapsulating the die and the substrate. The die includes die contacts, such as bond pads or redistribution contacts on a circuit side thereof, in electrical communication with integrated circuits on the die. The die also includes planarized wire bonding contacts on the die contacts, and a planarized polymer layer encapsulating the wire bonding contacts. The planarized polymer layer prevents physical contact between the die encapsulant and the integrated circuits on the circuit side of the die, and functions as a stress defect barrier between the integrated circuits and fillers contained in the die encapsulant.

In a second embodiment, a chip on board (COB) package includes a die having a planarized polymer layer and planarized wire bonding contacts. The die is back bonded and wire bonded to a COB substrate and a second die is attached to the die using an adhesive layer. The planarized polymer layer protects the die from fillers in the adhesive layer.

In a third embodiment, a stacked package includes the die having the planarized polymer layer and the planarized wire bonding contacts. In addition, the die is back bonded to a substantially similar die, mounted to a substrate and encapsulated in a die encapsulant.

In a fourth embodiment, a lead on chip (LOC) package includes a die having the planarized polymer layer and planarized wire bonding contacts. In addition, the die is attached and wire bonded to a segment of a lead on chip lead frame and encapsulated in a die encapsulant.

In each embodiment, the package can be used to construct systems such as modules, circuit boards, and systems in a package (SIP).

The method includes the step of providing a semiconductor substrate, such as a semiconductor wafer, containing a plurality of semiconductor dice having the die contacts on the circuit sides thereof. The method also includes the step of forming bumps on the die contacts, encapsulating the bumps in a polymer layer, and then planarizing the polymer layer and the bumps to form planarized wire bonding contacts. In addition, the method includes the step of singulating the dice from the semiconductor substrate such that each die includes a planarized polymer layer, and planarized wire bonding contacts encapsulated in the polymer layer.

The method also includes the steps of providing a lead frame containing a plurality of substrates, and attaching the dice to the substrates using one or more adhesive members. During the attaching step, the adhesive members are placed on the planarized polymer layers on the circuit sides of the dice. The attaching step is followed by the steps of wire bonding the planarized wire bonding contacts to conductors on the substrate, encapsulating the dice on the substrates, and singulating the substrates from the lead frame.

DETAILED DESCRIPTION OF THE PREFERRED EMBODIMENT

As used herein, the term "semiconductor package" refers to an electronic element that includes a semiconductor die. Exemplary semiconductor packages include chip scale packages, BGA devices, flip chip devices, BOC packages, COB packages, stacked packages and lead on chip (LOC) packages.

Referring to FIGS. 2A–2E, steps in the method for fabricating a board on chip (BOC) semiconductor package 40 (FIG. 4E) in accordance with the invention are illustrated.

Figure 2A:
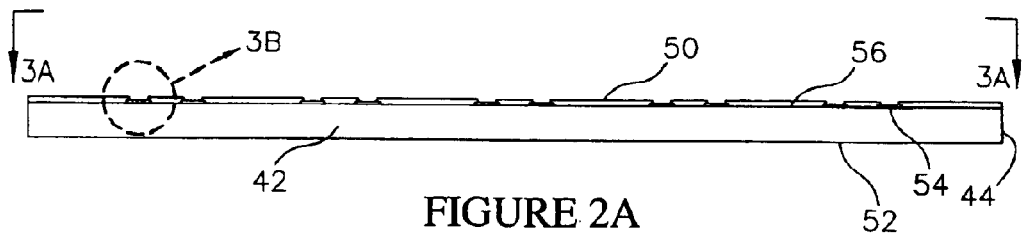
FIGS. 2A–2E are schematic cross sectional views illustrating steps in the method of the invention.
Figure 3A:
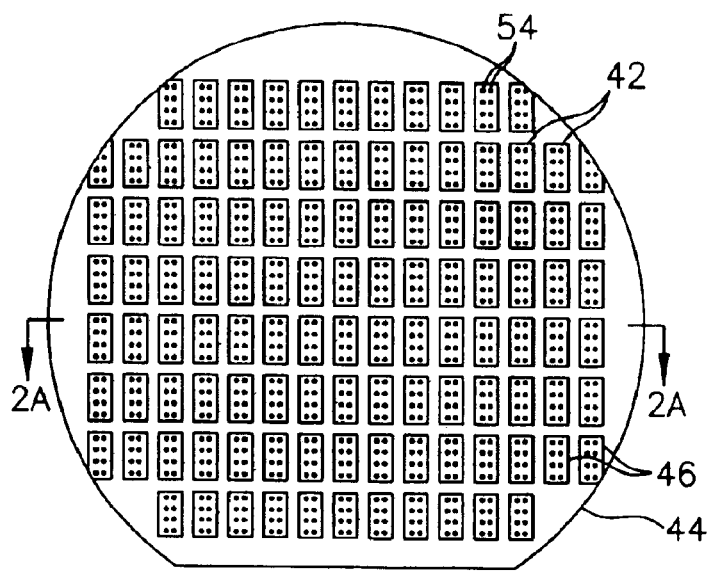
FIG. 3A is a plan view taken along line 3A—3A of FIG. 2A illustrating semiconductor dice on a substrate.
Figure 4A:
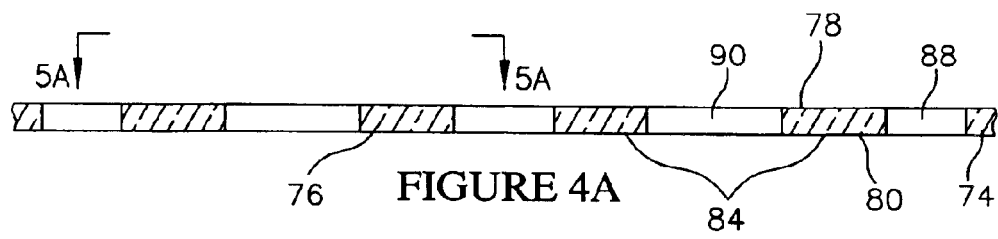
FIGS. 4A–4E are schematic cross sectional views illustrating steps in the method of the invention.
Figure 4B:
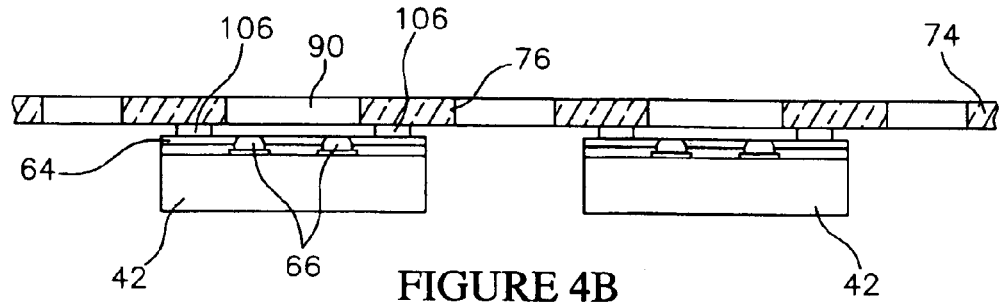
Figure 4C:
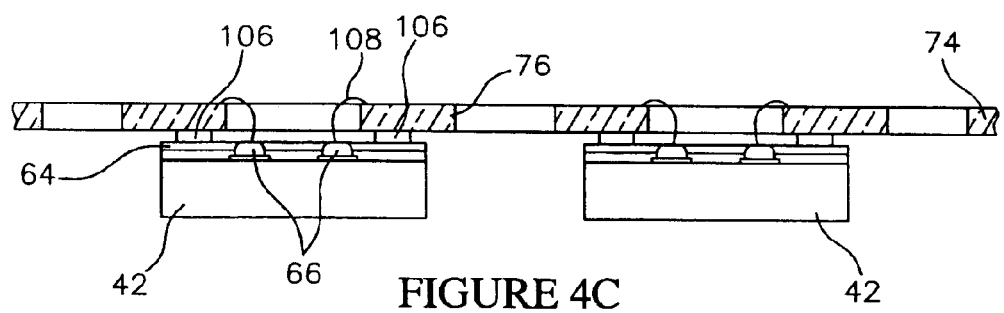
Figure 4D:
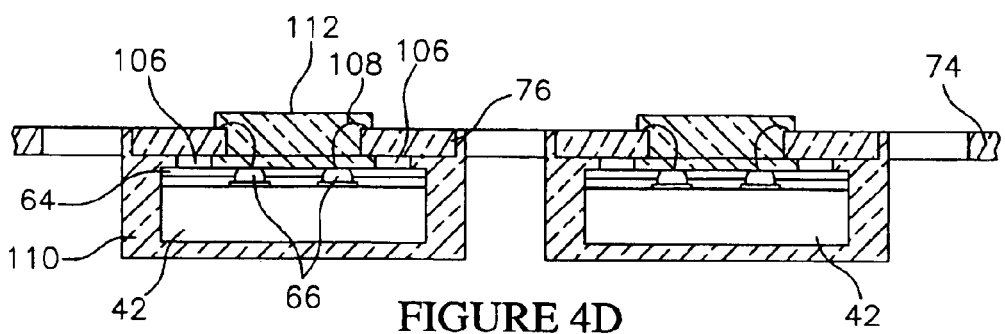
Figure 4E:
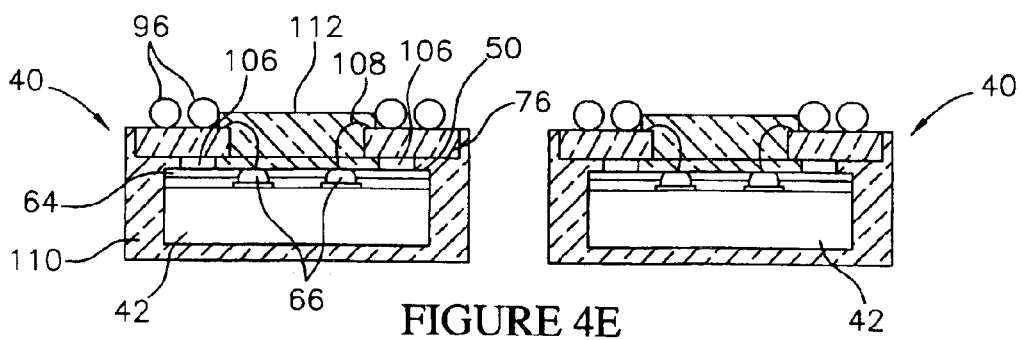

Initially, as shown in FIGS. 2A and 3A, a plurality of semiconductor dice 42 are provided, for fabricating a plurality of BOC semiconductor packages 40 (FIG. 4E). The dice 42 can comprise conventional semiconductor dice having a desired configuration. For example, each die 42 can comprise a dynamic random access memory (DRAM), a static random access memory (SRAM), a flash memory, a microprocessor, a digital signal processor (DSP) or an application specific integrated circuit (ASIC). The dice 42 and the BOC packages 40 can have any polygonal shape. In the illustrative embodiment, the dice 42 and the BOC packages 40 are rectangular in shape, but other polygonal shapes, such as square or hexagonal can also be utilized.

As shown in FIG. 3A, the dice 42 are contained on a semiconductor substrate 44. In the illustrative embodiment, the semiconductor substrate 44 comprises a semiconductor wafer fabricated using conventional processes. However, it is to be understood that the method can be performed on a portion of a wafer, on a panel, or on any other substrate that contains multiple semiconductor dice. The dice 42 are formed on the semiconductor substrate 44 with integrated circuits and semiconductor devices using techniques that are well known in the art. As also shown in FIG. 3A, the dice 42 are separated by streets 46 on the semiconductor substrate 44.

As shown in FIG. 2A, each die 42 includes a circuit side 50 and a back side 52. Each die 42 also includes a pattern of die contacts 54 formed on the circuit side 50 thereof in electrical communication with the integrated circuits thereon. In the illustrative embodiment the die contacts 54 are the bond pads for the die 42. Alternately, the die contacts 54 can comprise redistribution contacts in electrical communication with the bond pads for the die 42. In addition, the die contacts 54 can have a desired size, spacing and pattern (e.g., dense area array). Further, the die contacts 54 preferably comprise a bondable metal such as Al, Ni, Cu, Au, Ag, Pt, Pd, Sn, Zn and alloys of these metals.

Figure 3B:
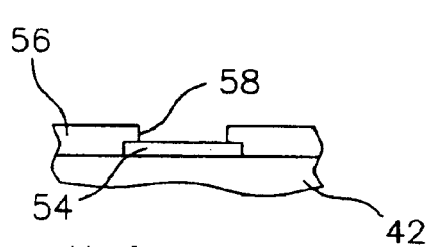
FIG. 3B is an enlarged view taken along line 3B of FIG. 2A illustrating a die contact.

As shown in FIGS. 2A and 3B, each die 42 also includes a die insulating layer 56 having openings 58 (FIG. 3B) aligned with the die contacts 54. In the illustrative embodiment, the die insulating layer 56 comprises the die passivation layer and the die contacts 54 are embedded in the die insulating layer 56. However, the die insulating layer 56 can comprise any electrically insulating material including glasses such as BPSG, polymers such as polyimide and resist, and oxides such as $SiO_2$. In addition, the openings 58 can be formed using a conventional process such as by forming a photo patterned mask (not shown) and etching the openings 58 through corresponding openings in the mask.

Figure 2B:
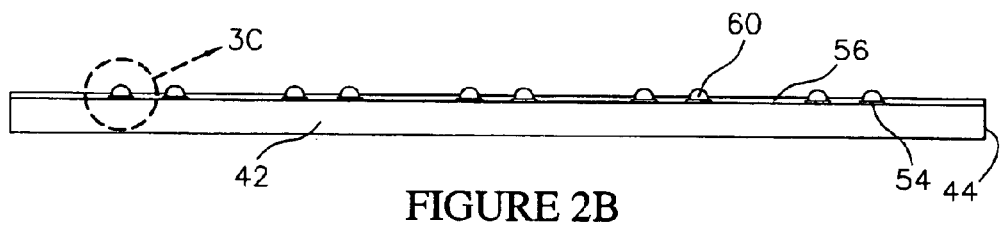
Figure 3C:
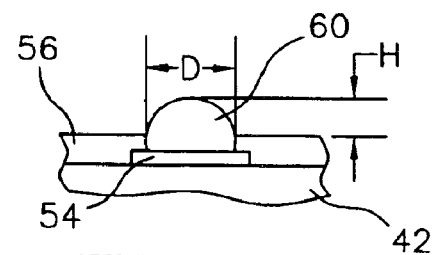
FIG. 3C is an enlarged view taken along line 3C of FIG. 2B illustrating a bump on the die contact.

Referring to FIGS. 2B and 3C, bumps 60 are formed on the die contacts 54 in electrical communication with the integrated circuits on the dice 42. In the illustrative embodiment the bumps 60 are generally hemispherical in shape. However, other shapes such as convex, block or cylindrical can also be employed. In addition, the bumps 60 comprise a wire bondable metal such as Al, Ni, Cu, Au, Ag, Pt, Pd, Sn, Zn and alloys of these metals.

The bumps 60 can be formed using a deposition process, such as electrolytic deposition, electroless deposition, CVD, sputtering, stenciling or screen printing. Alternately, the bumps can be formed using a bonding process such as by bonding pre-fabricated balls to the die contacts 54 using a reflow oven, or a ball bumper apparatus. The bumps 60 can also be formed using a conventional wire bonder apparatus adapted to form a ball bond, and then to sever the attached wire. A representative diameter D (or height H) of the bumps 60 can be from about 0.127 mm (0.005-in) to about 0.400 mm (0.016-in) or larger.

Figure 2C:
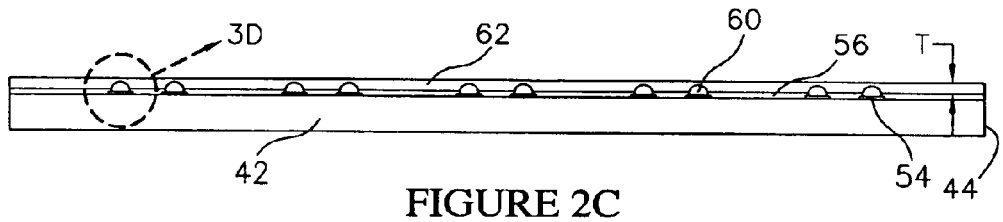
Figure 3D:
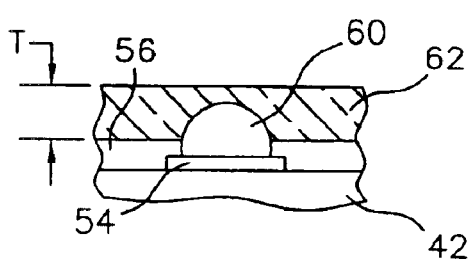
FIG. 3D is an enlarged view taken along line 3D of FIG. 2C illustrating a polymer layer on the bump.

Referring to FIGS. 2C and 3D, a polymer layer 62 is blanket deposited on the substrate 44 and covers the circuit sides 50 of the dice 42 contained on the substrate 44. The polymer layer 62 can comprise a no flow, curable underfill material. In addition, as shown in FIG. 3D, a thickness T of the polymer layer 62 can be greater than the height H of the bumps 60. Alternately, the thickness T of the polymer layer 62 can be about the same as, or less than, the height H of the bumps 60.

The polymer layer 62 can be deposited in a viscous state using a suitable deposition process, such as positive displacement through a nozzle, screen printing, stenciling or pin transfer. Systems are commercially available for performing each of these processes in the context of semiconductor packaging. For example, material dispensing systems are manufactured by Asymtek of Carlsbad, Calif., and by Camalot of Cookson, UK.

As a primary constituent, the polymer layer 62 includes an electrically insulating polymer base material such as an epoxy resin, a silicone resin, a polyimide resin, or a similar elastomeric material having suitable non-flowing and curable properties. One specific commercial polymer resin that can be used to form the polymer layer 62 is manufactured by Dexter Electronic Materials of Rocky Hill, Conn. under the trademark "HYSOL" FF2000.

Following deposition in a viscous state, the polymer layer 62 can be cured to harden. For example, curing can be performed by placing the substrate 44 in an oven at a temperature of about 90° to 165° C. for about 30 to 60 minutes.

Figure 2D:
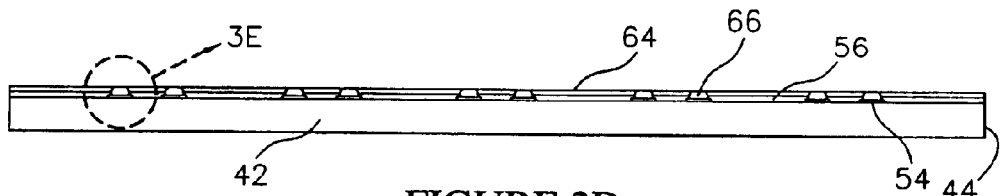
Figure 3E:
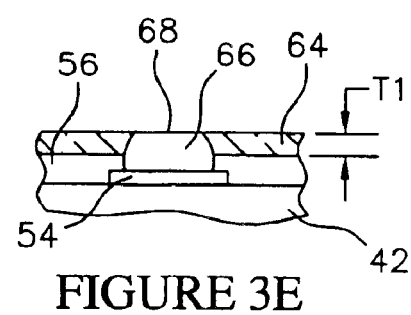
FIG. 3E is an enlarged view taken along line 3E of FIG. 2D illustrating a planarized polymer layer and wire bonding contact.

Referring to FIGS. 2D and 3E, following the curing step, the polymer layer 62 and the bumps 60 are planarized to form a planarized polymer layer 64, and a plurality of planarized wire bonding contacts 66 encapsulated in the planarized polymer layer 64. By way of example, the planarized polymer layer 64 can have a thickness T1 of about 20 µm to 100 µm.

The planarization step can be performed using a mechanical planarization apparatus, such as a grinder. One suitable mechanical planarization apparatus is manufactured by Okamoto, and is designated a model no. VG502. The planarization step can also be performed using a chemical mechanical planarization (CMP) apparatus. A suitable CMP apparatus is commercially available from a manufacturer such as Westech, SEZ, Plasma Polishing Systems, or TRUSI. The planarization step can also be performed using an etch back process, such as a wet etch process, a dry etch process or a plasma etching process.

As shown in FIG. 3E, the planarization step forms the wire bonding contacts 66 with an exposed, planarized, wire bonding surfaces 68. In addition, the wire bonding contacts 66 are encapsulated in the planarized polymer layer 64 but with the wire bonding surfaces 68 exposed. Also, the wire bonding contacts 66 are offset from the die contacts 54 in the Z direction by a distance equal to the thickness T1 of the planarized polymer layer 64.

Figure 2E:
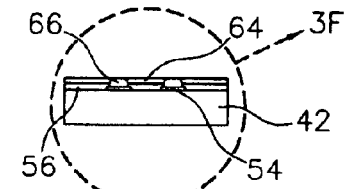

Referring to FIG. 2E, a singulating step is performed to singulate the dice 42 from the semiconductor substrate 44 and from one another. During the singulating step, a dicing tape 70 is applied to the semiconductor substrate 44, and grooves 72 are sawn, or otherwise formed through the semiconductor substrate 44. The singulating step can be performed using a dicing saw having saw blades with a selected width. Alternately the singulating step can be performed using another singulation method, such as cutting with a laser or a water jet, or by etching the semiconductor substrate 44 with a suitable wet or dry etchant.

Figure 3F:
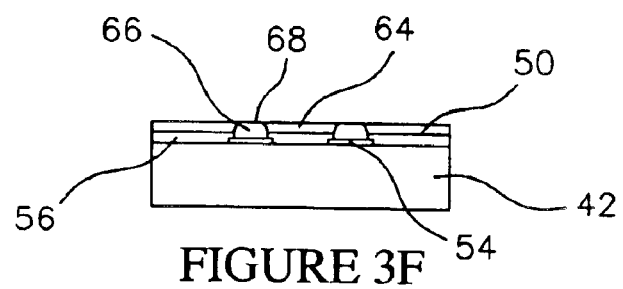
FIG. 3F is an enlarged view taken along line 3F of FIG. 2E illustrating a singulated die with the planarized polymer layer and the wire bonding contacts.

As shown in FIG. 3F, each die 42 includes a pattern of wire bonding contacts 66 having exposed, planarized wire bonding surfaces 68. The pattern and pitch of the wire bonding contacts 66 matches the pattern and the pitch of the die contacts 54. In addition, each die 42 includes a planarized polymer layer 64 encapsulating the wire bonding contacts 66 and the circuit side 50 of the die 42. As will be further explained, the planarized polymer layer 64 functions as a stress defect barrier in the completed package 40 (FIG. 3F).

Referring to FIGS. 4A–4E, additional steps in the method of the invention are illustrated. As shown in FIG. 4A, a lead frame 74 containing a plurality of BOC substrates 76 suitable for constructing a plurality of BOC semiconductor packages 40 (FIG. 4E) in accordance with the invention is illustrated. Each BOC substrate 76 is a segment of the lead frame 74, and will subsequently be separated from the adjacent BOC substrates 76 to form the BOC semiconductor packages 40 (FIG. 4E).

Figure 5A:
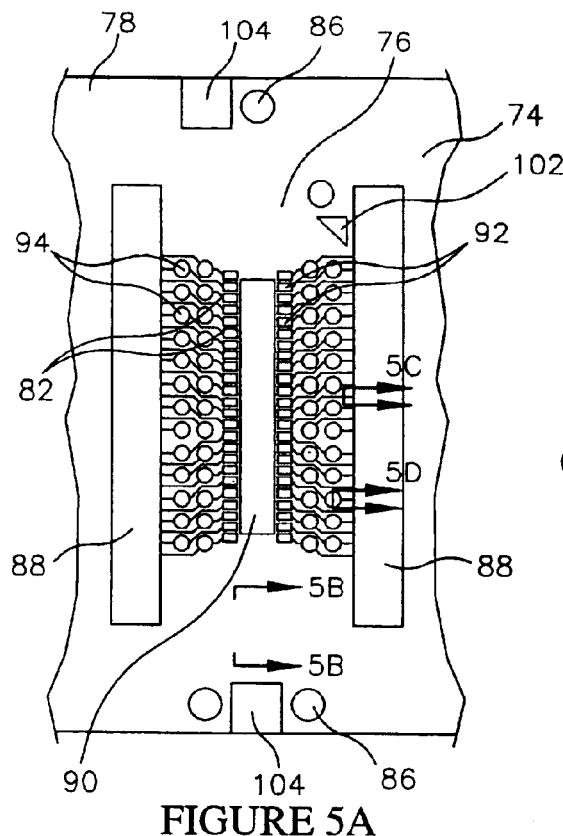
FIG. 5A is an enlarged view taken along line 5A—5A of FIG. 4A illustrating a segment of a lead frame used in the method of the invention.

Each BOC substrate 76 includes a first surface 78 and an opposing second surface 80. The first surface 78, and the second surface 80, are the major planar surfaces of the BOC substrates 76. As shown in FIG. 5A, each BOC substrate 76 includes a pattern of conductors 82 formed on the first surface 78 thereof. In addition, each BOC substrate 76 also includes a corresponding die attach area 84 formed on the second surface 80 thereof.

The BOC substrates 76 comprise an electrically insulating material such as an organic polymer resin reinforced with glass fibers. Suitable materials for the BOC substrates 76 include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. A representative thickness of the BOC substrates 56 can be from about 0.2 mm to 1.6 mm.

As shown in FIG. 5A, the lead frame 74 includes circular indexing openings 86 formed through the BOC substrates 76 and proximate to the longitudinal edges thereof. The indexing openings 86 permit the lead frame 74 to be handled by automated transfer mechanisms associated with chip bonders, wire bonders, mold tooling fixtures, and ball bonding machinery. In addition, the lead frame 74 includes elongated separation openings 88 which facilitate singulation of the BOC substrates 76 on the lead frame 74 into separate BOC semiconductor packages 40 (FIG. 5E). The BOC substrates 76 also include wire bonding openings 90 which provide access for wire bonding the semiconductor dice 42 (FIG. 4B) to the patterns of conductors 82 (FIG. 5A) on the BOC substrates 76.

Referring to FIG. 5A, the conductors 82 comprise a highly conductive metal layer, which is blanket deposited onto the substrate 76 (e.g., electroless or electrolytic plating), and then etched in required patterns. Rather than etching the conductors 82, an additive process, such as electroless deposition through a mask, can be used to form the conductors 82 in required patterns. A preferred metal for the conductors 82 is copper. Other suitable metals for the conductors 82 include aluminum, titanium, tungsten, tantalum, platinum, molybdenum, cobalt, nickel, gold, and iridium. If desired, the BOC substrates 76 and the conductors 82 can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

As shown in FIG. 5A, each conductor 82 includes a wire bonding pad 92 and a ball bonding pad 94. The wire bonding pads 92 can include metal layers, such as nickel and gold, selected to facilitate the wire bonding process. The ball bonding pads 94 can also include metal layers and solder flux layers, selected to facilitate attachment of terminal contacts 96 (FIG. 4E) to the ball bonding pads 94. In addition, the ball bonding pads 94 can be arranged in a dense area array such as a ball grid array (BGA) or fine ball grid array (FBGA).

Figure 5B:
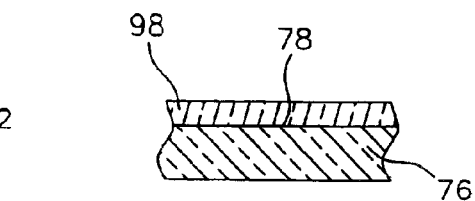
FIG. 5B is a cross sectional view taken along line 5B—5B of FIG. 5A illustrating a solder mask on the lead frame.
Figure 5C:
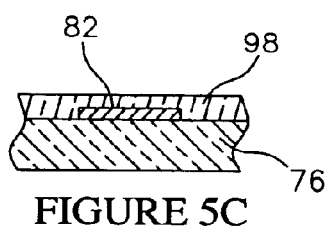
FIG. 5C is a cross sectional view taken along line 5C—5C of FIG. 5A illustrating a conductor on the lead frame.
Figure 5D:
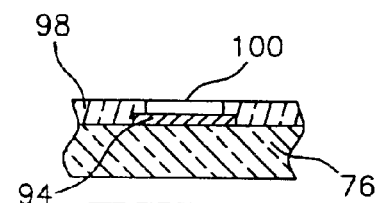
FIG. 5D is a cross sectional view taken along line 5D—5D of FIG. 5A illustrating a ball bonding pad on the lead frame.

As shown in FIG. 5B, a solder mask 98 substantially covers the first surface 78. The solder mask 98 can comprise a photoimageable dielectric material, such as a negative or positive tone resist. As shown in FIG. 5C, the solder mask 98 also substantially covers the conductors 82. As shown in FIG. 5D, the solder mask 98 includes openings 100 aligned with the ball bonding pads 94. The openings 100 can be formed by photo patterning and developing the solder mask 98. As shown in FIG. 5A, the first surface 78 of the lead frame 74 also includes triangular metal segments 102 which function as pin #1 indicators. The first surface 78 also includes rectangular metal segments 104 which function as mold compound gate breaks.

Referring to FIG. 4B, a die attaching step is performed using a conventional die attach apparatus. During the die attaching step, the die 42 formed substantially as previously described and shown in FIG. 3F, are attached to the die attach areas 84 on the lead frame 74. Adhesive members 106 attach the dice 42 to the lead frame 74. The adhesive members 106 can comprise a tape material, such as polyimide, covered on both sides with an adhesive. Alternately, the adhesive members 106 can comprise a filled or unfilled epoxy or acrylic material deposited on the dice 42 or the lead frame 74, and then cured as required. As also shown in FIG. 4B, the adhesive members 106 are attached to the planarized polymer layer 64 on the circuit side 50 of the dice 42. In addition, the wire bonding contacts 66 on the dice 42 align with the wire bonding openings 90 in the substrates 76.

Referring to FIG. 4C, following the die attaching step, a wire bonding step is performed using a conventional wire bonding apparatus. During the wire bonding step wires 108 are bonded to the planarized wire bonding surfaces 68 (FIG. 3E) on the wire bonding contacts 66, and to the wire bonding pads 92 (FIG. 5A) on the BOC substrates 76.

Figure 1A:
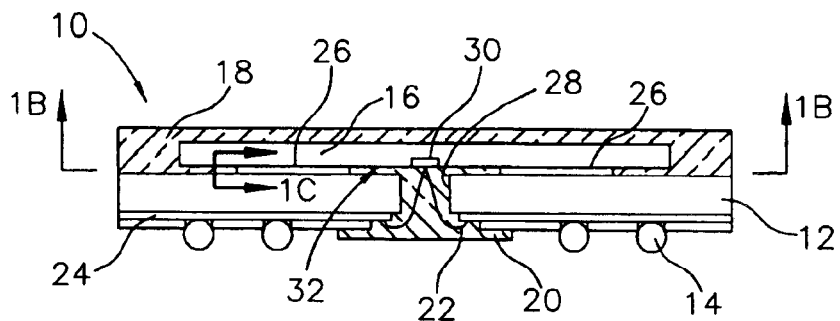
FIG. 1A is an enlarged schematic cross sectional view of a prior art BOC package.
Figure 1B:
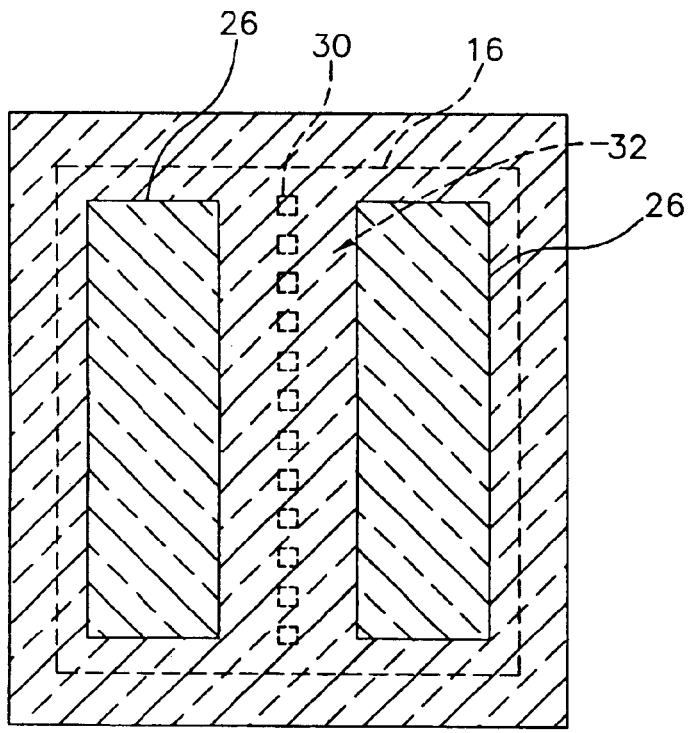
FIG. 1B is a cross sectional view taken along line 1B—1B of FIG. 1A.
Figure 1C:
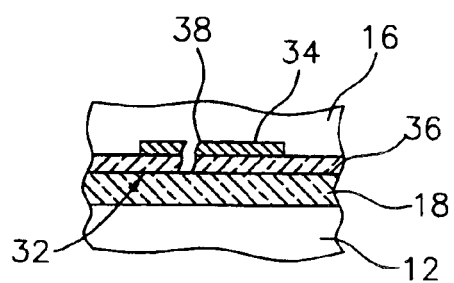
FIG. 1C is an enlarged cross sectional view taken along section line 1C—1C of FIG. 1A.

Referring to FIG. 4D, following the wire bonding step, a molding step is performed in which a die encapsulant 110 is molded to the second surface 80 of each BOC substrate 76 to encapsulate each die 42. The die encapsulant 110 can comprise a suitable plastic molding compound such as a Novolac based epoxy, molded into a desired shape using a transfer molding apparatus, and then cured using an oven. In the illustrative embodiment, the die encapsulant 110 has a generally rectangular shape. In addition, the die encapsulant 110 encapsulates the edges of the die 42 and the edges of the BOC substrate 76. However, the circuit side 50 of the die 42 is protected by the planarized polymer layer 64. Accordingly, stress defects 38 (FIG. 1C) cannot form in the die 42 from the interaction of circuit elements on the circuit side 50 with fillers in the die encapsulant 110.

As also shown in FIG. 4D, a wire bond encapsulant 112 can be formed on the wires 108, in the wire bonding openings 90, and on the wire bonding contacts 66. The wire bond encapsulant 112 can comprise a molded plastic material formed as previously described for the die encapsulant 110. Alternately the wire bond encapsulant 112 can comprise a glob top material, such as an epoxy, a silicone or a polyimide resin. As with the die encapsulant 110, the planarized polymer layer 64 protects the circuit side 50 of the die 42 from fillers in the wire bond encapsulant 112.

Referring to FIG. 4E, following the molding step, a terminal contact forming step is performed in which the terminal contacts 96 are formed on the ball bonding pads 94. The terminal contacts 96 can comprise solder or metal balls formed using a conventional reflow or bonding process. Alternately, the terminal contacts 96 can comprise solder or metal balls formed using a deposition process such as stenciling, screen printing, electroless deposition, electrolytic deposition, CVD or sputtering. As also shown in FIG. 4E, a singulating step can be performed to singulate the completed BOC packages 40 from the lead frame 74. The singulating step can be performed using a conventional shearing or sawing apparatus.

Each BOC package 40 includes a semiconductor die 42 having the circuit side 50 protected by the planarized polymer layer 64. In addition to physically protecting the die 42, particularly from fillers in the die encapsulant 110 and the wire bond encapsulant 112, the planarized polymer layer 64 encapsulates and electrically insulates the circuit side 50 and the wire bonding contacts 66. The planarized polymer layer 64 also permits the adhesive members 106 to be made thinner. Prior art adhesive members typically have a thickness greater than the largest diameter filler contained therein, to prevent pressing of the fillers into the die 42. On the other hand, the present adhesive members 106 can have a thickness that is less than the diameter of the fillers because the planarized polymer layer 64 protects the die 42 from the fillers. By way of example, a thickness of the adhesive members 106 can be reduced from about 100 $\mu$m to about 50 $\mu$m.

Figure 6A:
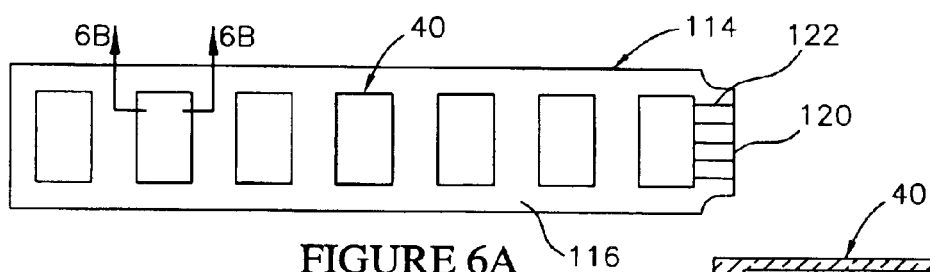
FIG. 6A is a plan view of a module system that includes packages constructed in accordance with the invention.
Figure 6B:
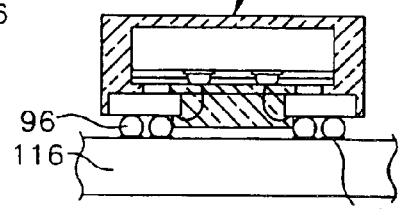
FIG. 6B is a cross sectional view of a package of the module system taken along section line 6B—6B of FIG. 6A.

Referring to FIGS. 6A and 6B, a multi chip module system 114 constructed with one or more BOC packages 40 is illustrated. The multi chip module system 114 includes a module substrate 116 having an edge connector 120, a plurality of conductors 122 in electrical communication with the edge connector 120, and a plurality of electrodes 118 (FIG. 6B) in electrical communication with the conductors 122. The BOC package 40 can be flip chip mounted to the module substrate 116, with the terminal contacts 96 thereon bonded to the electrodes 118.

Figure 7:
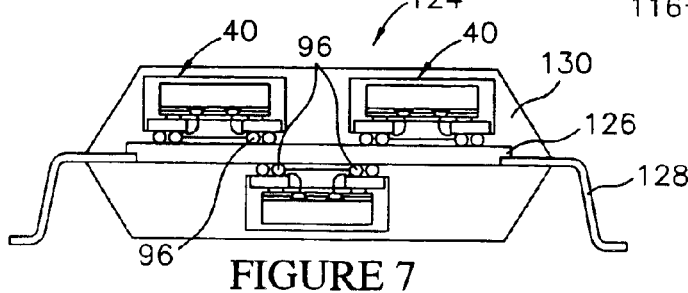
FIG. 7 is a schematic cross sectional view of a system in a package (SIP) that includes packages constructed in accordance with the invention.

Referring to FIG. 7, a system in a package (SIP) 124 is constructed with one or more BOC packages 40 is illustrated. This type of package is also referred to as a multi chip module MCM package. The system in a package (SIP) 124 can be configured to perform a desired function such as micro processing. The system in a package (SIP) 124 includes a package substrate 126 having terminal leads 128. The BOC packages 40 can be flip chip mounted to the package substrate 126, with the terminal contacts 96 bonded to the package substrate 126 in electrical communication with the terminal leads 128. The system in a package (SIP) 124 also includes a package body 130 encapsulating the BOC packages 40 and the package substrate 126.

Figure 8A:
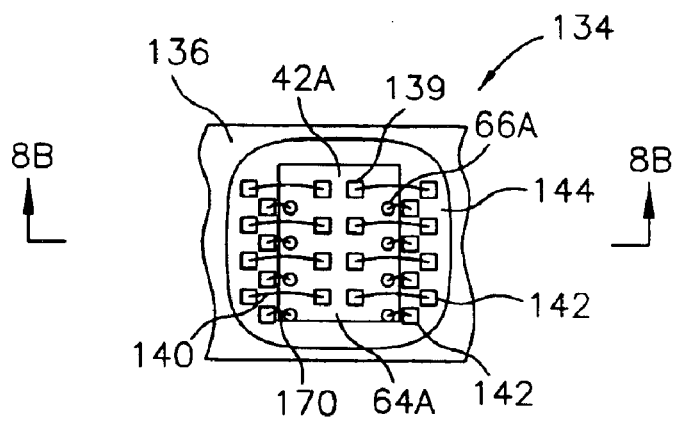
FIG. 8A is a plan view of an alternate embodiment chip on board (COB) package constructed in accordance with the invention.
Figure 8B:
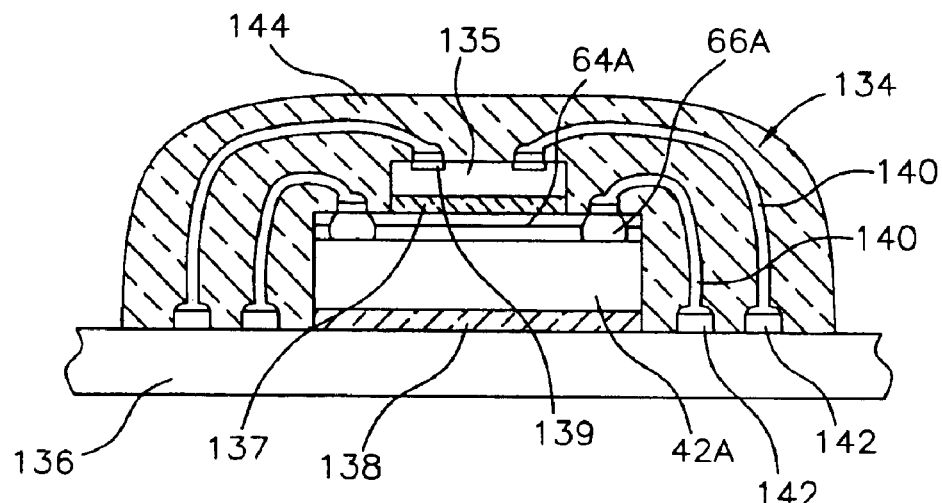
FIG. 8B is an enlarged cross sectional view of the chip on board (COB) package taken along section line 8B—8B of FIG. 8A.

Referring to FIGS. 8A and 8B, an alternate embodiment chip on board (COB) package 134 is illustrated. The COB package 134 includes a semiconductor die 42A having a planarized polymer layer 64A and planarized wire bonding contacts 66A constructed substantially as previously described and shown in FIG. 3F. However, the planarized wire bonding contacts 66A are located proximate to edges of the die 42A.

The COB package 134 also includes a COB substrate 136 having a pattern of electrodes 142. The die 42A is back bonded to the COB substrate 136 with an adhesive layer 138. In addition, wires 140 are wire bonded to the electrodes 142 on the COB substrate 136 and to the wire bonding contacts 66A on the die 42A.

The COB package 134 also includes a second die 135 back bonded to the die 42A in a stacked configuration. The second die 135 is wire bonded to the COB substrate 136 using wires 140 bonded to the electrodes 142 on the COB substrate 136 and to bond pads 139 on the second die 135. In addition, a polymer adhesive layer 137 attaches the second die 135 to the die 42A. The polymer adhesive layer 137 can comprise an epoxy, an acrylic or a polyimide material having one or more fillers contained therein. In this case, the planarized polymer layer 64A protects the die 42A from the fillers contained in the adhesive layer 137, and reduces stress defects in the die 42A substantially as previously described. The COB package 134 also includes a die encapsulant 144 encapsulating the die 42, the wires 140 and a portion of the COB substrate 136.

Figure 9:
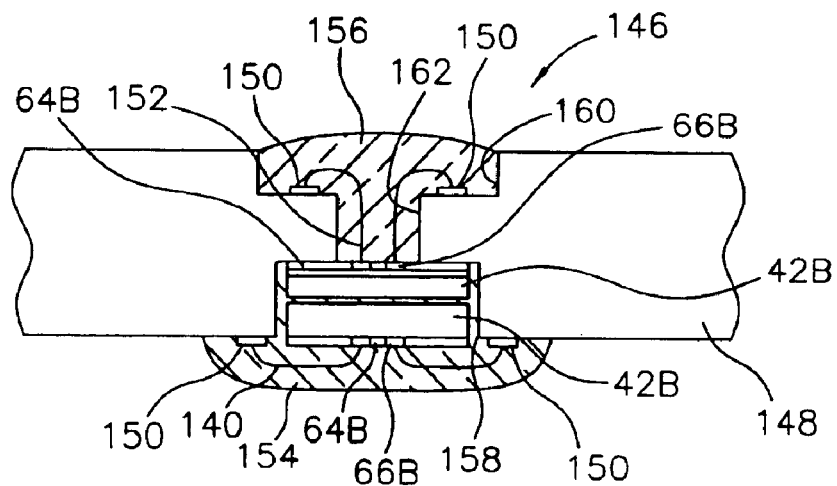
FIG. 9 is a schematic cross sectional view of an alternate embodiment stacked package constructed in accordance with the invention.

Referring to FIG. 9, an alternate embodiment stacked package 146 is illustrated. The stacked package 146 includes a supporting substrate 148 having a first recess 158, a second recess 160 and patterns of electrodes 150. A pair of dice 42B are stacked and adhesively bonded back to back, and mounted in the first recess 158. The dice 42B can be substantially identical to one another, and constructed substantially as previously described for the die 42.

Each die 42B includes a planarized polymer layer 64B, and planarized wire bonding contacts 66B, constructed substantially as previously described and shown in FIG. 3F for the die 42. The supporting substrate 148 also includes a wire bonding opening 162, and wires 152 wire bonded to the planarized wire bonding contacts 66B on the dice 42B and to the electrodes 150 on the supporting substrate 148. The stacked package 146 also includes a first encapsulant 154 in the first recess 158 encapsulating the stacked dice 42B, and a second encapsulant 156 in the second recess 160, and in the wire bonding opening 162 encapsulating the wires 152 therein. The planarized polymer layers 64B protect the circuit sides of the dice 42B from fillers in the encapsulants 154, 156, and reduces stress defects in the dice 42B substantially as previously described.

Figure 10:
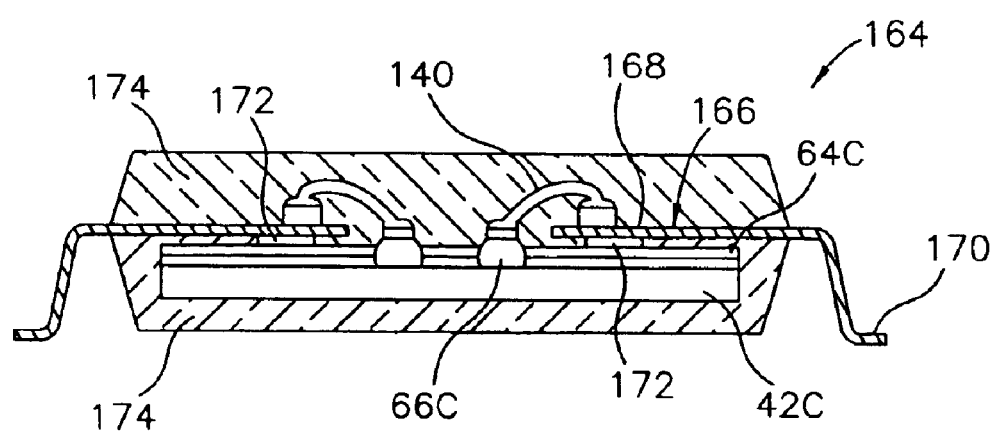
FIG. 10 is a schematic cross sectional view of an alternate embodiment LOC package constructed in accordance with the invention.

Referring to FIG. 10, an alternate embodiment lead on chip (LOC) package 164 is illustrated. The LOC package 164 includes a semiconductor die 42C attached to a substrate 166 which comprises a segment of a lead on chip lead frame. The die 42C includes a planarized polymer layer 64C and planarized wire bonding contacts 66C, constructed substantially as previously described and shown in FIG. 3F for the die 42. The substrate 166 includes lead fingers 168 which form the terminal leads 170 for the LOC package 164. Wires 140 are wire bonded to the lead fingers 168 and to the planarized wire bonding contacts 66C. In addition, adhesive members 172, such as strips of double sided tape, or cured polymer layers, attach the die 42C to the lead fingers 168.

The LOC package 164 also includes a die encapsulant 172 on the die 42C, and on either side of the lead fingers 168, forming a package body. The die encapsulant 172 can comprise a molded epoxy substantially as previously described for die encapsulant 110 (FIG. 4E). As with the previous embodiments, the planarized polymer layer 64C protects the integrated circuits on the circuit side of the die 42C from fillers contained in the die encapsulant 172.

The LOC package 164 can be constructed substantially as previously described and shown in FIGS. 2A–2E, and 4A–4E for package 40. However, in this case the organic lead frame 74 (FIG. 4A) is replaced by an LOC lead frame. The LOC lead frame can comprise an etched or stamped metal plate, such as a copper or nickel alloy, having a conventional LOC configuration.

Thus the invention provides an improved semiconductor package having a stress defect barrier, a wafer level method for fabricating the package, and systems incorporating the package. While the invention has been described with reference to certain preferred embodiments, as will be apparent to those skilled in the art, certain changes and modifications can be made without departing from the scope of the invention as defined by the following claims.

What is claimed is:

1. A semiconductor package comprising:
    a substrate having a surface and plurality of conductors on the surface;
    a semiconductor die having a circuit side and a back side attached to the surface, the die comprising a plurality of die contacts on the circuit side, an insulating layer on the circuit side, a plurality of wire bonding contacts bonded to the die contacts, and a polymer layer on the circuit side encapsulating the wire bonding contacts;
    a plurality of wires bonded to the wire bonding contacts and to the conductors;
    a second die attached to the circuit side of the die; and
    an adhesive member attaching the second die to the circuit side, the polymer layer preventing physical contact between the circuit side and the adhesive member.

2. The semiconductor package of claim 1 wherein the die contacts and the polymer layer have a planarized surface.

3. The semiconductor package of claim 1 wherein the polymer layer comprises a no flow underfill material.

4. The semiconductor package of claim 1 wherein the substrate comprises a segment of a lead on chip lead frame.

5. The semiconductor package of claim 1 wherein the package has a lead on chip configuration.

6. A semiconductor package comprising:
    a substrate comprising a plurality of lead fingers;
    a semiconductor die having a circuit side and a back side attached to the substrate, the die comprising a plurality of die contacts on the circuit side, an insulating layer on the circuit side, a plurality of wire bonding contacts bonded to the die contacts, and a polymer layer on the circuit side encapsulating the wire bonding contacts;

a plurality of wires bonded to the wire bonding contacts and to the lead fingers; and a die encapsulant encapsulating the die and at least a portion of the lead fingers, the polymer layer preventing physical contact between the circuit side and the die encapsulant.

7. A semiconductor package comprising:

a substrate;

a die encapsulant on the substrate; and a first die attached to the substrate and encapsulated in the die encapsulant, the first die comprising a circuit side, an insulating layer on the circuit side, a plurality of contacts on the circuit side, and a polymer layer on the circuit side encapsulating the contacts and preventing physical contact between the die encapsulant and the circuit side;

a second die substantially identical to the first die, the second die stacked on the first die and encapsulated in the die encapsulant.

8. The semiconductor package of claim 7 wherein the contacts and the polymer layer have a planarized surface.

9. The semiconductor package of claim 7 wherein the polymer layer comprises a no flow underfill material.

10. The semiconductor package of claim 7 wherein the substrate comprises a recess wherein the first die and the second die are mounted.

* * * * *